United States Patent [19]

Endoh et al.

[11] 4,162,462

[45] Jul. 24, 1979

[54] NOISE REDUCTION SYSTEM

[75] Inventors: Kenjiro Endoh, Higashimine; Kazuo Kitagawa, Kawasaki; Hideshi Kira, Yokohama, all of Japan

[73] Assignee: Tokyo Shibaura Electric Co., Ltd., Kawasaki, Japan

[21] Appl. No.: 799,337

[22] Filed: May 23, 1977

[30] Foreign Application Priority Data

May 21, 1976 [JP] Japan .................................. 51-57863

[51] Int. Cl.$^2$ ............................................. H04B 1/64
[52] U.S. Cl. ........................................ 333/14; 179/1 P; 325/62; 330/126
[58] Field of Search .......................... 333/14; 307/264; 328/168, 169; 325/62, 65; 330/124 R, 126, 295; 179/1 P, 1 VL

[56] References Cited

U.S. PATENT DOCUMENTS

| | | | |
|---|---|---|---|
| 3,304,369 | 2/1967 | Dreyfus | 333/14 X |
| 3,735,290 | 5/1973 | Yamazaki | 333/14 |
| 3,815,039 | 6/1974 | Fujisawa et al. | 333/14 X |
| 3,873,945 | 3/1975 | Muraoka | 333/14 |
| 3,903,485 | 9/1975 | Dolby | 333/14 |
| 3,969,680 | 7/1976 | Wermuth | 333/14 X |
| 4,072,914 | 2/1978 | Haramoto et al. | 333/14 |

*Primary Examiner*—Paul L. Gensler
*Attorney, Agent, or Firm*—Oblon, Fisher, Spivak, McClelland & Maier

[57] ABSTRACT

A noise reduction system is provided with an encoder for compressing the dynamic range of an audio input signal in accordance with the amplitude of the input signal and recording the compressed one into a tape recorder, and a decoder for expanding the dynamic range of a reproduced audio signal from the tape recorder to the original one in accordance with the amplitude of the reproduced audio signal. The encoder includes a first controlled amplifier circuit in which, when the input audio signal is in low- and middle-levels, sufficient emphasis is made to the signal at high frequencies, and when it is in high-level, the emphasis quantity at high frequencies is restrictive. The decoder includes a second controlled amplifier circuit having a transfer function related to the character of the first controlled amplifier circuit substantially in inverse-function manner.

11 Claims, 11 Drawing Figures

F I G. 9
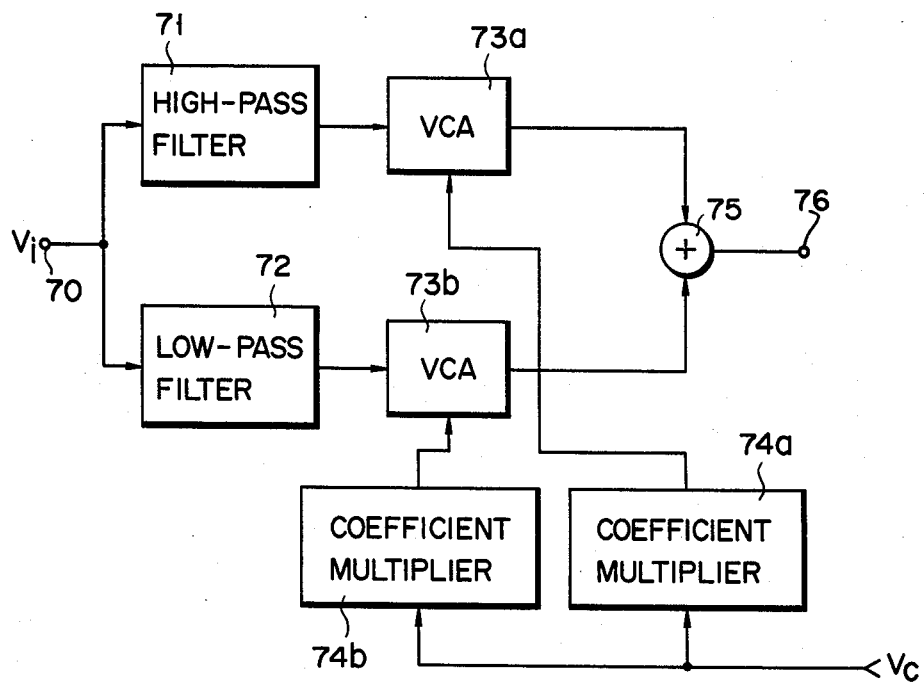

F I G. 10
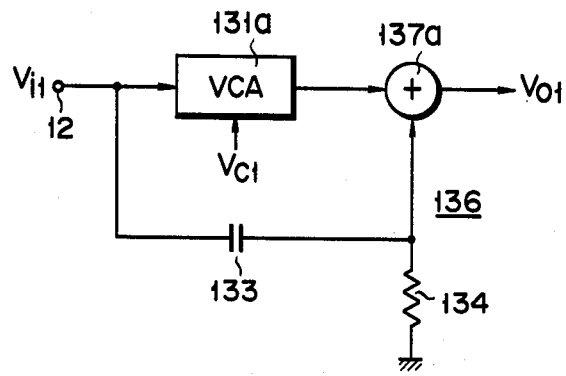
F I G. 11
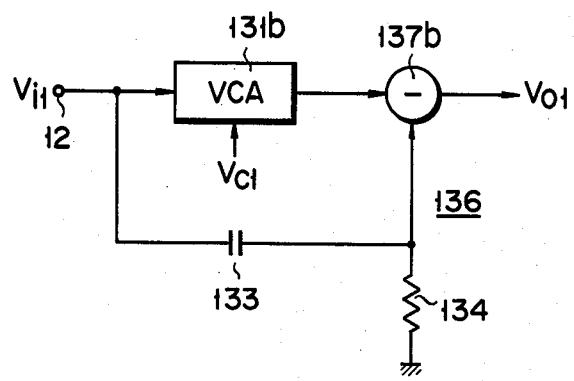

NOISE REDUCTION SYSTEM

BACKGROUND OF THE INVENTION

The present invention relates to a system for reducing a noise of a signal transmission medium and particularly to a noise reduction system for an audio signal recording and reproducing apparatus such as a tape recorder, and more particularly to a noise reduction system useful for a recording medium with narrow frequency band, high noise level and low saturation level, such as a cassette tape recorder.

Known is a noise reduction system of a compander system with excellent effect to improve signal-to-noise ratio (S/N) manufactured by dbx company of U.S.A. Details of this compander system are treated in U.S. Pat. Nos. 3,681,618, 3,789,143 and 3,714,462. A brief and only related description will be given here.

Generally, when a noise reduction system using a compander system having a wide control range and excellent effect to improve signal-to-noise ratio is used for a recording medium with narrow dynamic range device such as a cassette recording/reproducing device recorder, it is noted the following two phenomena.

1. Noises are scarcely heard in low- and middle-levels because of its excellent effect to improve signal-to-noise ratio. Accordingly, a modulation noise generated in the case of a high level signal is rather noticeable.

2. The noise level of the recording medium varies in accordance with the expansion operation at the reproducing period. Thus, when a recording medium with a noise level of −40 dB is used in the above-mentioned noise reduction system of dbx corporation, the improvement factor of S/N in this system is expressed −178 × (input signal level (dB)). For example, the improvement factor of S/N for the input signal −100 dB is 50 dB and the noise level is −90 dB, thus eliminating most of noise. For 0 dB input signal, the S/N improvement factor is 0 dB and the noise level is −40 dB, and noise level also is modulated with the level of a source.

Since the noise level modulation due to the above two phenomena is remarkable, when the recording or reproducing of a sound source with relatively simple harmonic constitution having small masking effect such as piano solo, the effects of the noise level modulation are not negligible in practical use.

For reducing the noise level modulation effects discussed above with regards to the second phenomenon, it is conceivable to additionally employ emphasis and de-emphasis circuits used to reduce the high frequency noise of an intermediate transmission (recording) medium such as a magnetic tape, and further to use a weighting operation is used in expanding and compressing the high-frequency range in order not to reduce the peak margin to the saturation level of the recording medium.

To the recording medium with narrow frequency band, high noise level and low saturation level such as cassette tape recorders, when such an improved system is applied, the noise level modulation occurs and the high frequency range of signal is not reproduced so that the reproduced sound is not clear. Further, since the level of the high frequency is high, there appears the noise level variation of the above-described first phenomenon. When an encoded signal formed by emphasizing a high level signal in the high-frequency range is recorded, deterioration of the high frequency characteristic and the increase of the noise level modulation are particularly remarkable.

SUMMARY OF THE INVENTION

Accordingly, an object of the present invention is to provide a noise reduction system effectively adaptable even for a cassette tape recorder.

According to the invention, there is provided a noise reduction system comprising an encoder including a first level detector for detecting the amplitude of an input audio signal passed through the encoder, and a first controlled amplifier circuit by which, when the amplitude of the input audio signal passed through the encoder is lower than a predetermined level, the quantity of the emphasis made to the high-frequency range of signal is increased above a predetermined quantity in response to the output of the first level detector, while, when it is above the predetermined one, the emphasis quantity is restrictive and the dynamic range of the input audio signal is compressed; and a decoder including a second level detector for detecting the amplitude of an encoder output fed through the recording medium, and a second controlled amplifier circuit having a transfer function related to that of the first controlled amplifier circuit substantially in inverse-function manner, in response to the output of the second level detector, the decoder expanding the dynamic range of the signal compressed in the encoder to the original one of the input audio signal.

BRIEF DESCRIPTION OF THE DRAWING

Other objects and features of the present invention will be apparent from the following description taken in connection with the accompanying drawings, in which:

FIG. 9 is a block diagram of another example of the controlled amplifier circuit to the encoder in FIG. 1; and FIGS. 10 and 11 are examples of the controlled amplifier used in the encoder.

DETAILED DESCRIPTION OF THE PREFERRED EMBODIMENTS

Figure 1:
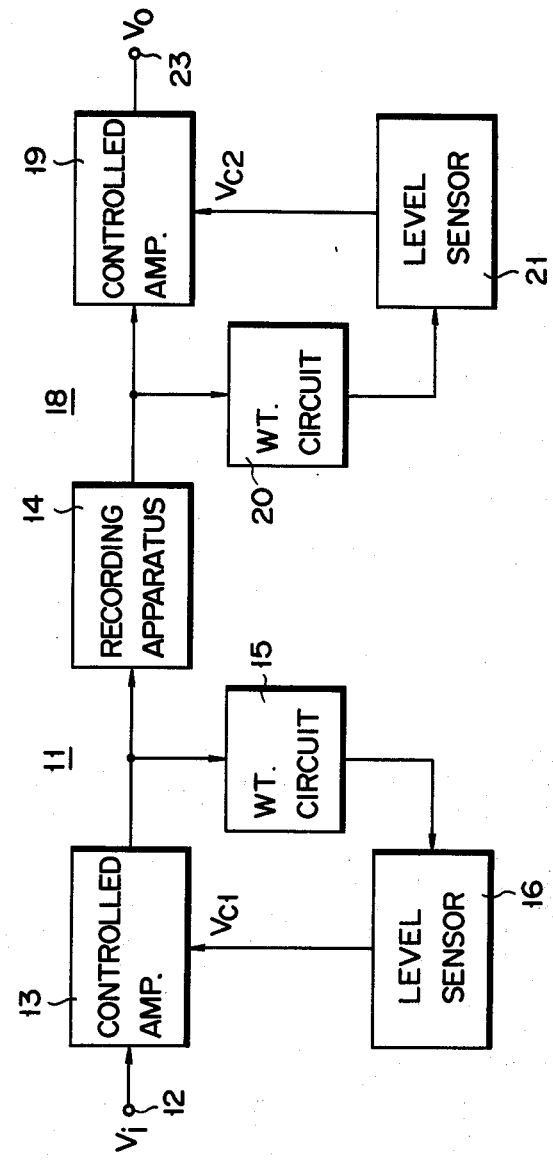
FIG. 1 shows a block diagram of an embodiment of a noise reduction system according to the present invention.
Figure 2:
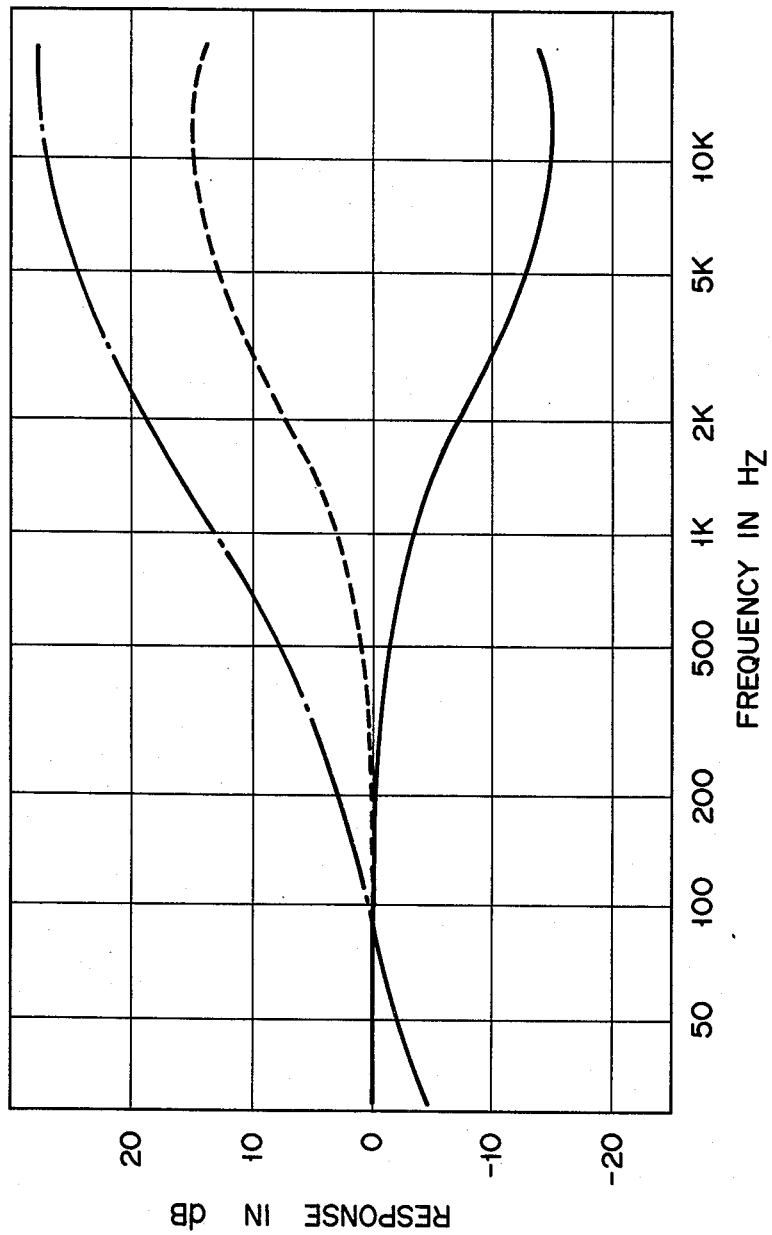
FIG. 2 shows a graph of the frequency-response characteristics of some circuit components of the noise reduction system of FIG. 1.

Reference will be made to FIG. 1 illustrating a noise reduction system of the invention. In the figure, an input audio signal $V_i$ is inputted into an input terminal 12 provided in an encoder 11 and then fed to a controlled amplifier circuit 13 to be described later in detail. The signal amplified in the controlled amplifier 13 is fed to a recording apparatus 14 such as a cassette tape recorder and a weighting circuit 15. The output signal of the controlled amplifier 13 is emphasized at high frequencies by a pre-emphasis circuit included in the controlled amplifier 13, which will be described later. The frequency-response of pre-emphasis is indicated by dashed line in FIG. 2. With such a characteristic, the peak margin of the signal to the saturation level of the recording apparatus 14 becomes small and hence the signal is distorted at high-frequency range. It is for this reason that the weighting circuit 15 is used, and to avoid such a defect. The frequency-response of the weighting circuit 15 has such a characteristics as indicated by an alternate long and short dash line shown in FIG. 2, in order to weight the energy in a specified frequency range of the input signal. Application of the output signal from the weighting circuit 15 to a level sensor 16 improves the sensitivity thereof at high frequencies. The output signal featured by such a character of the level sensor 16 is applied to the controlled amplifier circuit 13. The signal inputted to the controlled amplifier circuit 13 is a DC control voltage and designated by $V_{c1}$.

The output signal $V_{c1}$ of the level sensor 16 fed to the controlled amplifier circuit 13 serves to control the gain and the frequency characteristic of the circuit 13. The frequency-response of the amplifier circuit 13 is, for example, illustrated as in FIG. 3 with the parameter of the control voltage $V_{c1}$. When the control voltage $V_{c1}$ is high, the frequency response is similarly shaped irrespective of the voltage $V_{c1}$, and the high frequency-range is greatly emphasized. In this case, only the gain is controlled by the voltage $V_c$. The higher the control voltage $V_c$ becomes, the larger the gain increases. When the control voltage $V_c$ becomes near zero volt, the gain in high range is decreased more highly than that in low- and middle-frequency, lower than 500 Hz. The level sensor 16 produces the control votage $V_c$ of high amplitude, when the input level from the weighting circuit 15 is low, and produces near zero control volt $V_c$ at a high input level.

In this manner, when a low level input signal $V_i$ is applied to the encoder 11, it is amplified in the controlled amplifier circuit 13 with emphasis of the high-frequency components thereof. By contrast, when the signal $V_i$ is high, it is descreased in level with an increase of the peak margin. Additionally, since the high-frequency components are less emphasized, the peak margin at high frequencies is more increased.

The output signal of the encoder 11 is delivered to the recording apparatus 14. The reproduced signal from the recording apparatus 14 is fed to a controlled amplifier circuit 19 and a weighting circuit 20 in a decoder 18. The signal is de-emphasized at high frequencies, as indicated by a solid line in FIG. 2, by the de-emphasis circuit included in the controlled amplifier circuit 19 which will be referred to later. The weighting circuit 20 used in this side has the characteristic which is substantially the same to that of the circuit 15 for obtaining a DC control voltage having the same absolute value when the output level of the encoder 11 equals to the input level of the decoder 18. As will be seen, if the output signal of the weighting circuit 20 is applied to the level sensor 21 which is substantially the same as the encoder level sensor 16, the sensitivity of the level sensor 21 is enhanced at high frequencies. The output signal of the level sensor 21 is applied as a DC control signal $V_{c2}$ to the controlled amplifier circuit 19. The controlled amplifier 19 has the characteristics seen from the graph of FIG. 4 inverse to that of the controlled amplifier 13 of the encoder 11 shown in FIG. 3.

Figure 5:
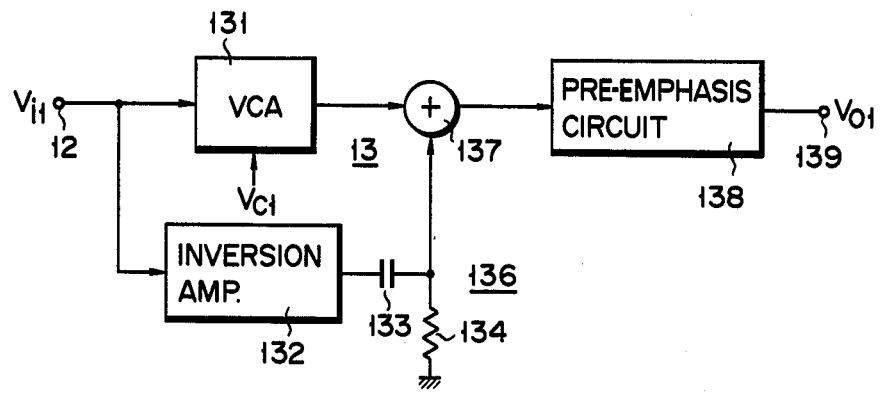
FIG. 5 shows a block diagram of the controlled amplifier circuit in the encoder of FIG. 1 system.

Turning now to FIG. 5, there is shown an example of the controlled amplifier circuit 13 used in the encoder 11. An audio signal fed to an input terminal 12 is applied to a voltage controlled amplifier (VCA) 131 and an inversion amplifier 132. The inversion amplifier 132 is connected at the output terminal to one end of a capacitor 133. The other end of the capacitor 133 is grounded via a resistor 134. The capacitor 133 and the resistor 134 constitute a high-pass filter 136. The output of the filter 136 is connected to one input terminal of an adder 137. The adder 137 is connected at the other input terminal with the output of the VCA 131 and at the output with a pre-emphasis circuit 138. The circuit 138 is connected at the output to an output terminal 139 of the controlled amplifier circuit 13. The VCA 131 of which the amplification factor A is controlled by the DC control signal $V_{c1}$ has a flat frequency characteristic. The outputs of the VCA and the output of the inversion amplifier 132 obtained through the high-pass filter 136 are summed in the adder 137 and the summed signal is in turn applied to the pre-emphasis circuit 138.

The transfer function $H(\omega)$ between the input signal $V_{i1}$ to be fed terminal 12 and the output signal $V_{o1}$ of the adder 137 is given $$|H(\omega)| = \left|\frac{V_{o1}}{V_{i1}}\right| = A\sqrt{\frac{1 + \omega_n^2(\frac{A-1}{A})^2}{\omega_n^2 + 1}}$$

Figure 6:
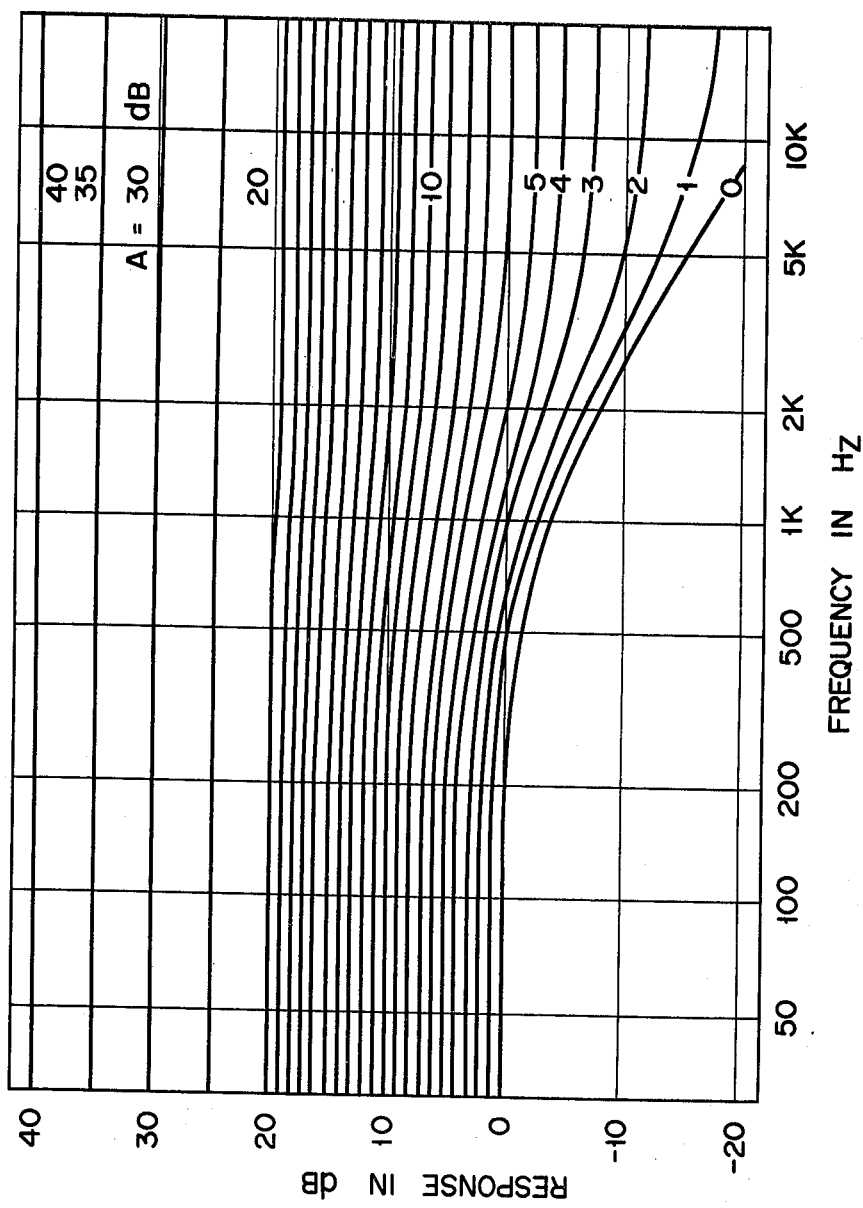
FIG. 6 is a graph illustrating the frequency-response characteristics of $V_{o1}$–$V_{il}$ in FIG. 5.

Here, $\omega_n = \omega cr$ where $\omega$ is angular frequency, c a capacitance of the capacitor 133 and r a resistance of the resistor 134. FIG. 6 shows the frequency-response of this transfer function $H(\omega)$ for $\omega_n = 5828$ sec$^{-1}$ at the amplification factor $A = 0$ (dB). The output $V_{o1}$ of the adder 137 is fed to pre-emphasis circuit 138 with a high frequency emphasis characteristic shown by the dashed line of FIG. 2, the control voltage $V_{c1}$ is changed in the manner as previously mentioned to change the amplitude thereof. At this time, when the amplitude is small, the quantity of the high frequency emphasis is lower compared to the case of a large amplitude, as shown in FIG. 3.

Figure 4:
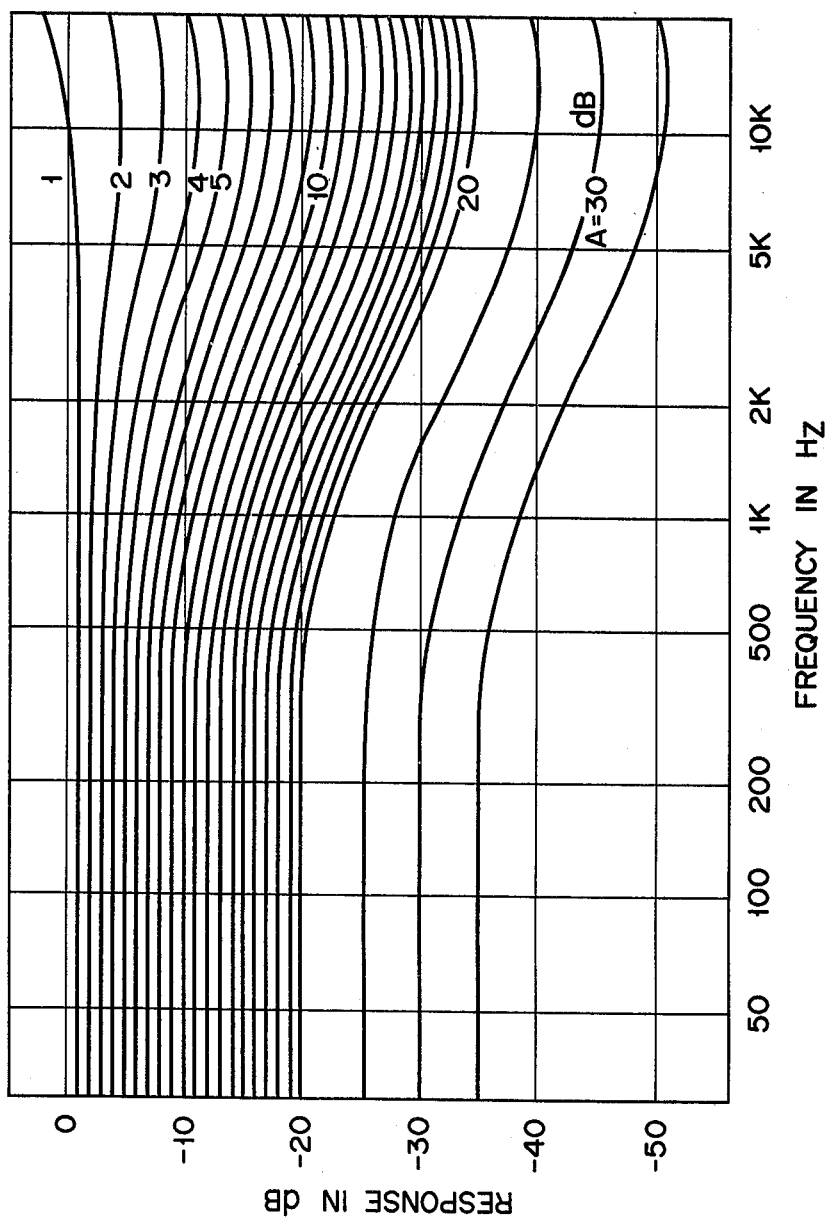
FIG. 4 shows a graph of the characteristics of a controlled amplifier circuit of the decoder in FIG. 1.
Figure 7:
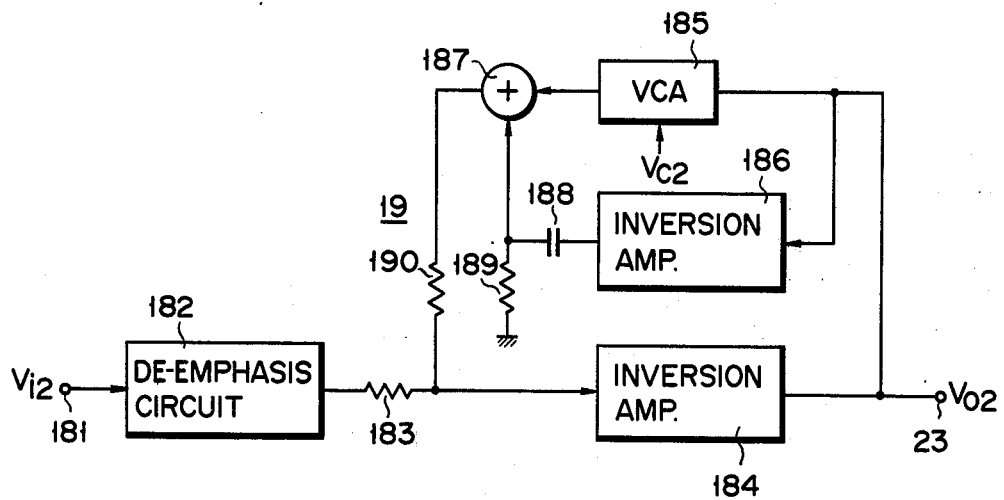
FIG. 7 is a block diagram of a controlled amplifier circuit of the decoder in FIG. 1.
Figure 8:
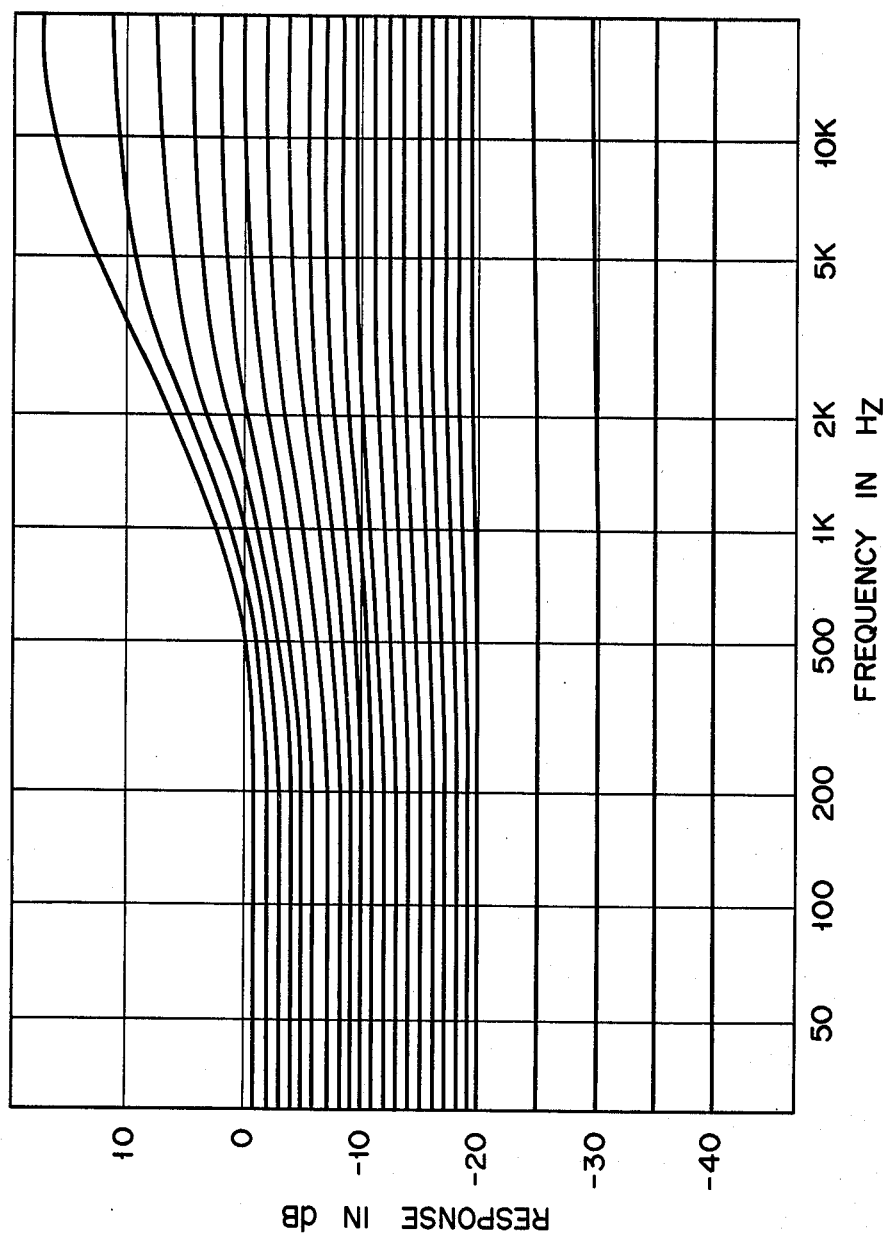
FIG. 8 is a graph of the frequency-response characteristics of $V_{o2}$–$V_{in}$ in FIG. 7.

The controlled amplifier circuit 19 in the decoder 18 is shown in FIG. 7. The response of the $V_{o2}$ with respect to the $V_{in}$ becomes as shown in FIG. 8 and has a transmission function opposite to that shown in FIG. 6. As shown in FIG. 7, the reproduced signal $V_{i2}$ from the recording apparatus 14 is applied to an input terminal 181 and then to a high frequency de-emphasis circuit 182 having the characteristic shown in the solid line of FIG. 2. As seen from FIG. 2, it is necessary that the de-emphasis circuit 182 has the characteristic related in inverse function to that of the pre-emphasis circuit 138. The output of the de-emphasis circuit 182 is applied through a resistor 183 to an inversion amplifier 184 where the signal is inverted in polarity. The polarity-inversed signal $V_o$ is delivered to the output terminal 23, and also applied to the voltage controlled amplifier (VCA) 185 and another inversion amplifier 186. The VCA 185 with a flat frequency characteristic exhibits an amplification factor A controlled by the control voltage $V_{c2}$ from the level sensor 21 of FIG. 1. An adder 187 is connected at one input terminal to the output of the VCA 185 and at the other input to the inversion amplifier 186 through a high-pass filter comprising a capacitor 188 and a resistor 189 one end of which is grounded. The output of the adder 187 is connected to the inversion amplifier 184 through a resistor 190. With such a construction, the transfer function of the decoder 18 is related to that of the encoder 11 in an inverse function manner and has a transmission characteristics as shown in FIG. 4.

Figure 3:
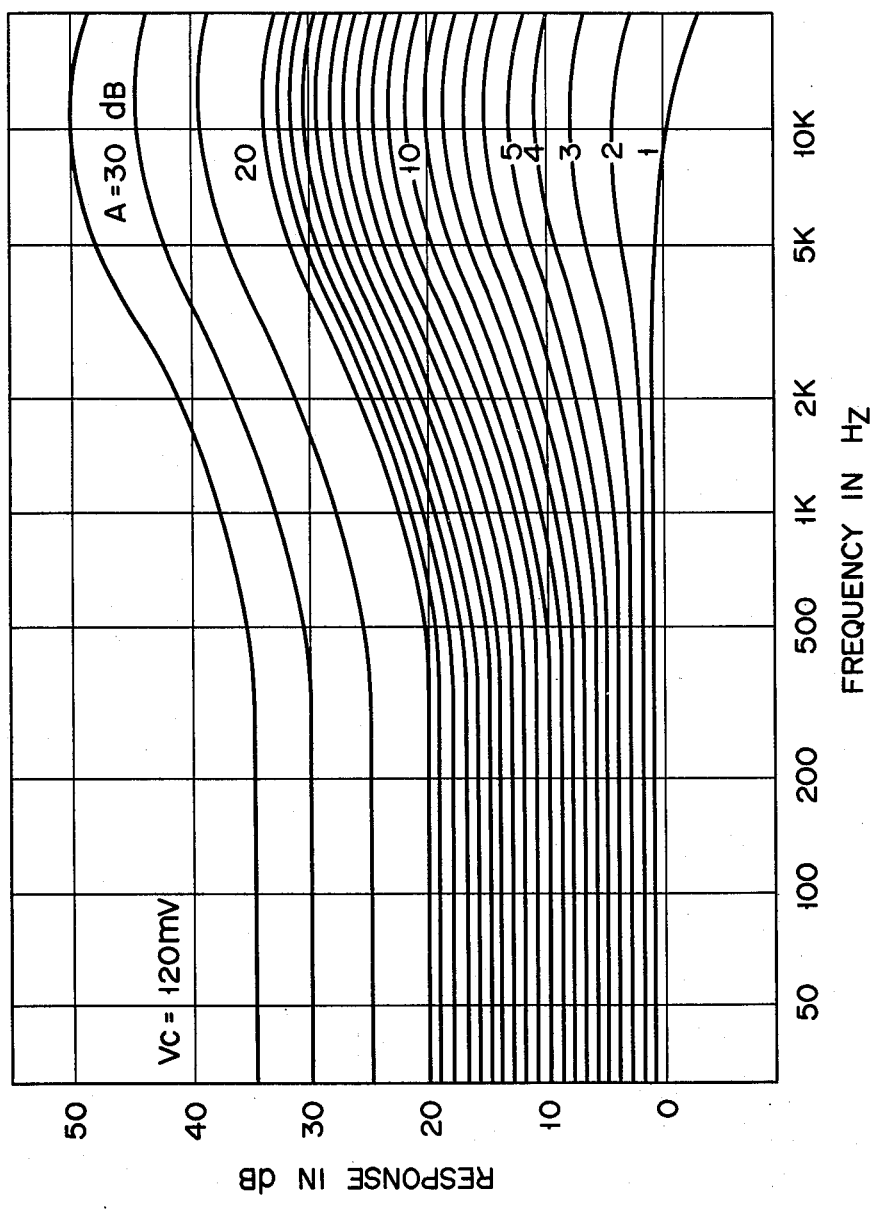
FIG. 3 shows a graph illustrating the frequency-response characteristics of a controlled amplifier circuit in the encoder of the FIG. 1 system.

The characteristics of the controlled amplifier circuit 13 of the encoder 11 are shown in FIG. 3. It is to be noted, however, that the controlled amplifier circuit 13 is not limited to such. Any circuit may be used if it satisfies a basic idea that, when the amplification factor is changed with change of the control voltage $V_c$, the quantity of the emphasis at high frequencies when the amplification factor is small is smaller than that when the amplification factor is large. As a matter of course, the controlled amplifier circuit 19 of the decoder 18 may also be similarly constructed.

Many useful effects are attained by the noise reduction system in which the controlled amplifier circuits 13 and 19 shown in FIGS. 5 and 7 are incorporated into the encoder and the decoder 11 and 18. For the middle- and low-level region input signals, as in the conventional case, the compression and expansion with sufficient dynamic range are permitted. This eliminates the need of level matching between the encoder and decoder. For the whole audio frequency range input signal, when the signal level is low and the gain of the control amplifier circuit is high in an encoding mode sufficient emphasis in the high frequency range is obtained so that the S/N is improved and the noise modulation effect is greatly reduced. And when the signal level is high and the gain is large in the encoding mode, the quantity of emphasis is little so that the saturation at high frequencies hardly takes place. In the high level, the emphasis quantity changes with the input signal level. Accordingly, it is necessary to match the signal level in encoding mode to that in decoding mode. However, the gain of the VCA is not so much reduced in the low- and middle-level of the input signal where most of the musical sounds exist. As a result, if the controlled amplifier circuit 13 shown in FIG. 5 is used, the frequency characteristic changes little as shown in FIG. 6 and hence the emphasis quantity also changes little. Therefore, even relatively rough matching of the signal levels reproduces natural sound feelings.

Turning now to FIG. 9, there is shown another example of the controlled amplifier circuit. In the figure, an input signal $V_i$ is inputted to an input terminal 70 and then distributed to a high-pass filter 71 and a low-pass filter 72 where the signal is divided into the high-frequency andd the middle- and low-frequency components and the output of the low- and high-pass filters 73 and 72 are controlled by VCAs 73a and 73b, respectively. In this case, the degree of the control of the VCA 73a by the control voltage $V_c$ through a coefficient multiplier 74a is set up larger than that of the VCA 73b through a coefficient multiplier 74b, where the output of the coefficient multipliers 74a and 74b are a multiple of the inputs thereto as determined by the coefficient thereof. With such a circuit construction, the emphasis quantity at high frequencies, when the gain between the input and output is large, is large as compared to the case of the small gain. Thus, the controlled amplifier circuit of this example is suitable for the noise reduction system of the invention. The outputs of the respective VCAs 73a and 73b are summed in an adder 75 and the summed signal is then delivered to an output terminals 76. As in the previous examples, the S/N is sufficiently improved. However, the emphasis quantity has no constant level region so that the signal level in encoding mode must be accurately matched to that in decoding mode. If the coefficient multiplier 74a with non-linear characteristic is used, the frequency-response characteristic as shown in FIG. 6 may be easily obtained. Further, by suitably selecting the characteristics of the coefficient multipliers 74a and 74b, the encode and decode characteristics may be easily obtained suitable to the characteristics of the transferring medium 14, i.e. the recoding medium. In the examples in FIGS. 5 and 7, non-inversion VCAs 131 and 185 are used, while inversion VCAs 131a and 185a may be used. In this case, the inversion amplifiers 132, 186 are not necessary as shown in FIGS. 10 and 11.

In FIG. 10 the input signal $V_{i1}$ applied to the input terminal 12 is supplied to an inversion type VCA 131a and a high-pass filter 136 consisting of a capacitor 133 and a resistor 134. The polarity-inverted output of the VCA 131a and the output of the high-pass filter 136 are added together at an adder 137a to obtain an output signal $V_{o1}$. Namely, a difference voltage between the outputs of the VCA 131a and the high-pass filter 136 is obtained by using the adder 137a.

FIG. 11 shows another example example of the circuit shown in FIG. 10. In FIG. 11, the input signal $V_{i1}$ is supplied from the input terminal 12 to a non-inversion type VCA 131b and a high-pass filter 136 consisting of a capacitor 133 and a resistor 134. The output of the VCA 131b and the output of the high-pass filter 136 are supplied to a subtractor 137b to obtain a difference voltage between the outputs of the VCA 131b and the high-pass filter 136.

In the examples shown in FIGS. 5 and 7, the pre-emphasis and de-emphasis circuits 138 and 182 are disposed at the sides of the controlled amplifier circuit 13 and 19 which are directly connected to the recording apparatus 14. These circuits 138 and 182, however, may be disposed at the sides of the controlled amplifier circuits 138 and 182 which are connected to the input and output terminals 12 and 23 of the noise reduction system. In the latter case, the effects obtained are as same as of the former case.

While the embodiments heretofore described are directed to improving the S/N at high frequencies by emphasizing the high-frequency components, the teachings of the invention are likewise applicable to improve the S/N at low frequencies by emphasizing the low-frequency components. The S/N both at low and high frequencies may be improved by emphasizing both the low- and high-frequency components. The system of the invention may be used together with the system in which the emphasis region is controlled in accordance with the spectrum constitution of the input signal $V_i$. In short, the noise reduction system of the present invention may be expressed as follows: with the definition that a first frequency range is a fixed one including a number of signal components or a variable one changing with the frequency components of a signal and a second frequency range is the one including a number of noise components and except the first frequency range; in encoding mode, the gain of the first frequency range is increased with the decrease of the input signal level and it is decreased with the increase of the same, and the emphasis quantity of the second frequency range with respect to the one of the first frequency range is increased with the decrease of the input signal level and it is descreased with the increase of the same; and in decoding mode, the noise reduction system operates in an inverse-function manner with respect to the encoding mode.

According to the invention, the S/N is remarkably improved. Further, when the signal level is low, the emphasis quantity is sufficiently increased so that noise modulated by the music sound level can hardly be heard, and when the signal level is high, the level at high frequencies does not increase so much. Therefore, even if the noise reduction system of the invention is applied to the recording medium with high noise level and low saturation level such as cassette tape recorders, satisfactory noise reduction may be attained.

Various other modifications of the disclosed embodiments will become apparent to person skilled in the art without departing from the spirit and scope of the invention as defined by the appended claims.

What we claim is:

1. A noise reduction system having an encoder for compressing the dynamic range of an input program signal in accordance with the amplitude thereof and for delivering a compressed signal to a signal transmission medium, and a decoder for expanding the dynamic range of an output signal of the signal transmission medium in accordance with the amplitude thereof, said encoder and decoder having emphasis and de-emphasis circuits for respectively and inversely emphasizing and de-emphasizing a specified frequency range of an operational audio frequency band, said specified frequency range not lying within a main frequency range in which the majority of the energy of said program input signal lies, comprising:

said encoder having a transfer function that for a predetermined relatively high level program input signal exhibits low gain over the full operational audio frequency band and a low degree of frequency emphasis in said specified frequency range, and that for relatively low-level and intermediate level program input signals exhibits high gain over the full operational audio frequency band and a high degree of frequency emphasis for the specified frequency range; and, said decoder having a substantially inverse transfer function relative to that of said encoder.

2. A noise reduction system according to claim 1 wherein said main frequency range is a low- and middle-frequency range and said specified frequency range is a high-frequency range of the audio frequency band.

3. A noise reduction system according to claim 1, comprising:

said encoder having first detecting means for detecting the level of an output signal of the encoder and first processing means for processing the program input signal in accordance with the output of the first detecting means in such a manner that for said high level program input signals the gain of the first processing means becomes low, and the degree of emphasis in the specified frequency range becomes low and for said low level and intermediate level program input signals the gain thereof becomes high, and the degree of emphasis for the specified frequency range becomes high; and said decoder having second detecting means for detecting the level of an input signal of the decoder and second processing means for processing the input signal of the decoder in accordance with the output of the second detecting means in such a manner that the second processing means has a transfer function related to that of said first processing means substantially in inverse-function manner.

4. A noise reduction system according to claim 3, in which said encoder comprises: first and second filter means for dividing the program input signal into said main and specified frequency range signals; first and second voltage controlled amplifiers which receive the outputs of said first and second filter means, respectively, and of which the gain changes in according with a control voltage obtained from said level detecting means; first and second coefficient multipliers for supplying the control voltage to said first and second voltage controlled amplifiers; and means for summing the outputs of said first and second voltage controlled amplifiers.

5. A noise reduction system according to claim 3, further comprising:

said first detecting means having a first weighting circuit connected to the output terminal of the encoder for weighting the energy of a specified weighting frequency range of the output signal of the encoder and a first level sensor for detecting the level of an output signal of the first weighting circuit; and said second detecting means having a second weighting circuit connected to the input terminal of the decoder for weighting the energy of the specified weighting frequency range of the input signal of the decoder and a second level sensor for detecting the level of the output signal of the second weighting circuit.

6. A noise reduction system according to claim 5, wherein said decoder includes a voltage controlled amplifier to which an output signal of said second level sensor is supplied, and a high-pass filter circuit connected to the input of the voltage controlled amplifier—, means for combining an output of the decoder voltage controlled amplifier with an output of the decoder high-pass filter—for further increasing the gain of the decoder for said specified frequency range as compared to the decrease in gain of the decoder for said main frequency range as the level of said program input signal to the decoder increases, and said decoder further includes said de-emphasis circuit for de-emphasizing the energy of the program signal in said specified frequency range.

7. A noise reduction system according to claim 6 wherein said decoder comprises a feedback amplifier for amplifying the signal flowing through the decoder, and a feedback path connected across the input and output of the feedback amplifier.

8. A noise reduction system according to claim 5 wherein said encoder include a voltage controlled amplifier to which an output signal of said first level sensor is supplied,— means for reducing a signal component of said specified frequency range from an output of the voltage controlled amplifier,—and said encoder further includes said pre-emphasis circuit for emphasizing the energy of said program signal in said specified frequency range.

9. A noise reduction system according to claim 8 wherein said first voltage controlled amplifier is of an inversion type, and said encoder further includes a first high-pass filter circuit, a first adder for obtaining a sum between an output of the first voltage controlled amplifier and an output of the first high-pass filter circuit.

10. A noise reduction system according to claim 8 wherein said first voltage controlled amplifier is of a non-inversion type, and said encoder further includes a first high-pass filter circuit, and a first subtractor for obtaining a difference between an output of the first voltage controlled amplifier and an output of the first high-pass filter circuit.

11. A noise reduction system according to claim 8 wherein said first voltage controlled amplifier is of a non-inversion type, and said encoder further includes a first high-pass filter circuit, a first inversion amplifier serially connected with said first high-pass filter circuit and a first adder for obtaining a sum between an output of the first voltage controlled amplifier and an output of the first high-pass filter circuit.

* * * * *